(12) United States Patent
Dosho et al.

(10) Patent No.: US 9,024,793 B2
(45) Date of Patent: May 5, 2015

(54) OVERSAMPLING TIME-TO-DIGITAL CONVERTER

(71) Applicant: Panasonic Corporation, Osaka (JP)

(72) Inventors: Shiro Dosho, Osaka (JP); Masao Takayama, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/172,718

(22) Filed: Feb. 4, 2014

(65) Prior Publication Data

US 2014/0152484 A1    Jun. 5, 2014

Related U.S. Application Data

(63) Continuation of application No. PCT/JP2012/002822, filed on Apr. 25, 2012.

(30) Foreign Application Priority Data

Aug. 11, 2011    (JP) ................................. 2011-175855

(51) Int. Cl.
   *H03M 1/48*    (2006.01)
   *H03M 1/50*    (2006.01)
   (Continued)

(52) U.S. Cl.
   CPC ............... *H03M 1/50* (2013.01); *G04F 10/005* (2013.01); *H03K 5/153* (2013.01)

(58) Field of Classification Search
   CPC ........ H03K 5/153; G04F 10/005; H03M 1/50
   USPC ........... 341/111, 155, 144, 143; 327/157, 159
   See application file for complete search history.

(56) References Cited

U.S. PATENT DOCUMENTS

| | | | |
|---|---|---|---|
| 7,439,784 B2* | 10/2008 | Lin | ................................ 327/157 |
| 8,362,932 B2* | 1/2013 | Pavlovic et al. | .............. 341/111 |

(Continued)

FOREIGN PATENT DOCUMENTS

JP    4480547 B2    6/2010

OTHER PUBLICATIONS

Jinn-Shyan Wang et al., "An Ultra-Low-Power Fast-Lock-In Small-Jitter All-Digital DLL," International Solid-State Circuits Conference, 2005, Session 22, PLL, DLL, and VCOs, 22.7, pp. 422-424.
Minjae Lee et al., "A 9 b, 1.25 ps Resolution Coarse-Fine Time-to-Digital Converter in 90 nm CMOS that Amplifies a Time Residue," IEEE Journal of Solid-State Circuits, vol. 43, No. 4, Apr. 2008, pp. 769-777.

(Continued)

*Primary Examiner* — Brian Young
(74) *Attorney, Agent, or Firm* — McDermott Will & Emery LLP

(57) ABSTRACT

An oversampling time-to-digital converter includes an input pulse generation circuit generating two pulse signals, a reference pulse generation circuit generating two pulse signals, a swap circuit swapping two pulse signals, a multiplexer selecting an output of the input pulse generation circuit or the swap circuit, a time-to-current conversion circuit outputting two pulse currents in accordance with an output of the multiplexer, a current mirror circuit whose input and output terminals receive the two pulse currents, an integration circuit integrating a differential current between the pulse current connected to the output terminal of the current mirror circuit and an output current of the current mirror circuit, and a comparison circuit comparing an output signal of the integration circuit to a threshold voltage. An output signal of the comparison circuit is given to the swap circuit as a control signal.

20 Claims, 13 Drawing Sheets

(51) Int. Cl.
    *G04F 10/00* (2006.01)
    *H03K 5/153* (2006.01)

(56) References Cited

U.S. PATENT DOCUMENTS

| | | | |
|---|---|---|---|
| 8,564,471 B1 * | 10/2013 | Gao et al. | 341/166 |
| 8,669,890 B2 * | 3/2014 | Wang et al. | 341/118 |
| 2006/0097772 A1 | 5/2006 | Sakiyama et al. | |
| 2009/0225631 A1 | 9/2009 | Shimizu et al. | |

OTHER PUBLICATIONS

Dong-Woo Jee et al., "A 2 GHz Fractional-N Digital PLL with 1b Noise Shaping ΔΣ TDC," 2011 Symposium on VLSI Circuits Digest of Technical Papers. pp. 116-117.

International Search Report issued in International Application No. PCT/JP2012/002822 with Date of mailing May 22, 2012, with English Translation.

* cited by examiner

EXTERNAL RESET SIGNAL

CONTROL SIGNAL

US 9,024,793 B2

OVERSAMPLING TIME-TO-DIGITAL CONVERTER

CROSS-REFERENCE TO RELATED APPLICATIONS

This is a continuation of International Application No. PCT/JP2012/002822 filed on Apr. 25, 2012, which claims priority to Japanese Patent Application No. 2011-175855 filed on Aug. 11, 2011. The entire disclosures of these applications are incorporated by reference herein.

BACKGROUND

The present disclosure relates to a time-to-digital converter which converts a time difference between edges of two input signals to a digital value.

In recent years, as the miniaturization of LSIs progresses, the operating voltage of LSIs is lowered. Therefore, it has been difficult to improve the SN ratio of a signal in signal processing in the voltage direction. Therefore, under the necessity of performing signal processing using analog quantity in the time direction, i.e., time difference information, in recent years, a time-to-digital converter which converts a time difference between edges of two input signals to a digital value has been developed. For example, see Jinn-Shyan Wang, Yi-Ming Wang, Chin-Hao Chen, Yu-Chia Liu, "An Ultra-Low-Power Fast-Lock-in Small-Jitter All-Digital DLL", ISSCC 2005/SESSION 22/PLL, DLL, AND VCOs/ 22.7, 2005 IEEE International Solid-State Circuit Conference, pp. 422-423 and 607.

A known time-to-digital converter realizes addition and subtraction of the time difference by delaying one of the two input signals by a delay circuit. However, the delay circuit has a large delay error, and therefore, it is difficult to improve conversion accuracy using a known method. As described above, the conversion accuracy of time-to-digital converters which have been developed up until today is not sufficient, and there is the need for the development of a time-to-digital converter which can generate highly accurate digital time-difference information that is to be a reference for each of various electronic devices.

As described above, there is a need for an oversampling time-to-digital converter which can convert time-difference information to a digital value with high accuracy.

SUMMARY

An oversampling time-to-digital converter according to an aspect of the present disclosure includes an input pulse generation circuit configured to generate two pulse signals from two input signals such that a time difference between respective start edges of the two pulse signals is equal to a time difference between respective edges of the two input signals and respective end edges of the two pulse signals match each other, a reference pulse generation circuit configured to generate two pulse signals from a reference clock signal such that a time difference between respective start edges of the two pulse signals is equal to a cycle of the reference clock signal and respective end edges of the two pulse signals match each other, a swap circuit configured to receive the two pulse signals output from the reference pulse generation circuit and to swap the received two pulse signals in accordance with a control signal to output the pulse signals, a multiplexer configured to receive the two pulse signals output from the input pulse generation circuit and the two pulse signals output from the swap circuit and to selectively output the two pulse signals output from the input pulse generation circuit or the swap circuit, a time-to-current conversion circuit configured to output two pulse currents in accordance with respective pulse widths of the two pulse signals output from the multiplexer, a current mirror circuit configured such that one of the two pulse currents is connected to an input terminal of the current mirror circuit and the other of the two pulse currents is connected to an output terminal of the current mirror circuit, an integration circuit configured to integrate a differential current between the pulse current connected to the output terminal of the current mirror circuit and an output current of the current mirror circuit, and a comparison circuit configured to compare an output signal of the integration circuit to a threshold voltage. An output signal of the comparison circuit is given as the control signal to the swap circuit.

An oversampling time-to-digital converter according to another aspect of the present disclosure includes an input pulse generation circuit configured to generate two pulse signals from two input signals such that a time difference between respective start edges of the two pulse signals is equal to a time difference between respective edges of the two input signals and respective end edges of the two pulse signals match each other, a reference pulse generation circuit configured to generate two pulse signals from a reference clock signal such that a time difference between respective start edges of the two pulse signals is equal to a cycle of the reference clock signal and respective end edges of the pulse signals match each other, a swap circuit configured to receive the two pulse signals output from the reference pulse generation circuit and to swap the received two pulse signals in accordance with a control signal to output the pulse signals, a first time-to-current conversion circuit configured to output two pulse currents in accordance with respective pulse widths of the two pulse signals output from the input pulse generation circuit, a second time-to-current conversion circuit configured to output two pulse currents in accordance with respective pulse widths of the two pulse signals output from the swap circuit, a current mirror circuit configured such that one of the two pulse currents output from the first time-to-current conversion circuit and one of the two pulse currents output from the second time-to-current conversion circuit are connected to an input terminal of the current mirror circuit and the other of the two pulse currents output from the first time-to-current conversion circuit and the other of the two pulse currents output from the second time-to-current conversion circuit are connected to an output terminal of the current mirror circuit, an integration circuit configured to integrate a differential current between the pulse current connected to the output terminal of the current mirror circuit and an output current of the current mirror circuit, and a comparison circuit configured to compare an output signal of the integration circuit to a threshold voltage. An output signal of the comparison circuit is given as the control signal to the swap circuit.

DETAILED DESCRIPTION

Embodiments will be hereinafter described with reference to accompanying drawings.

First Embodiment

Figure 1:
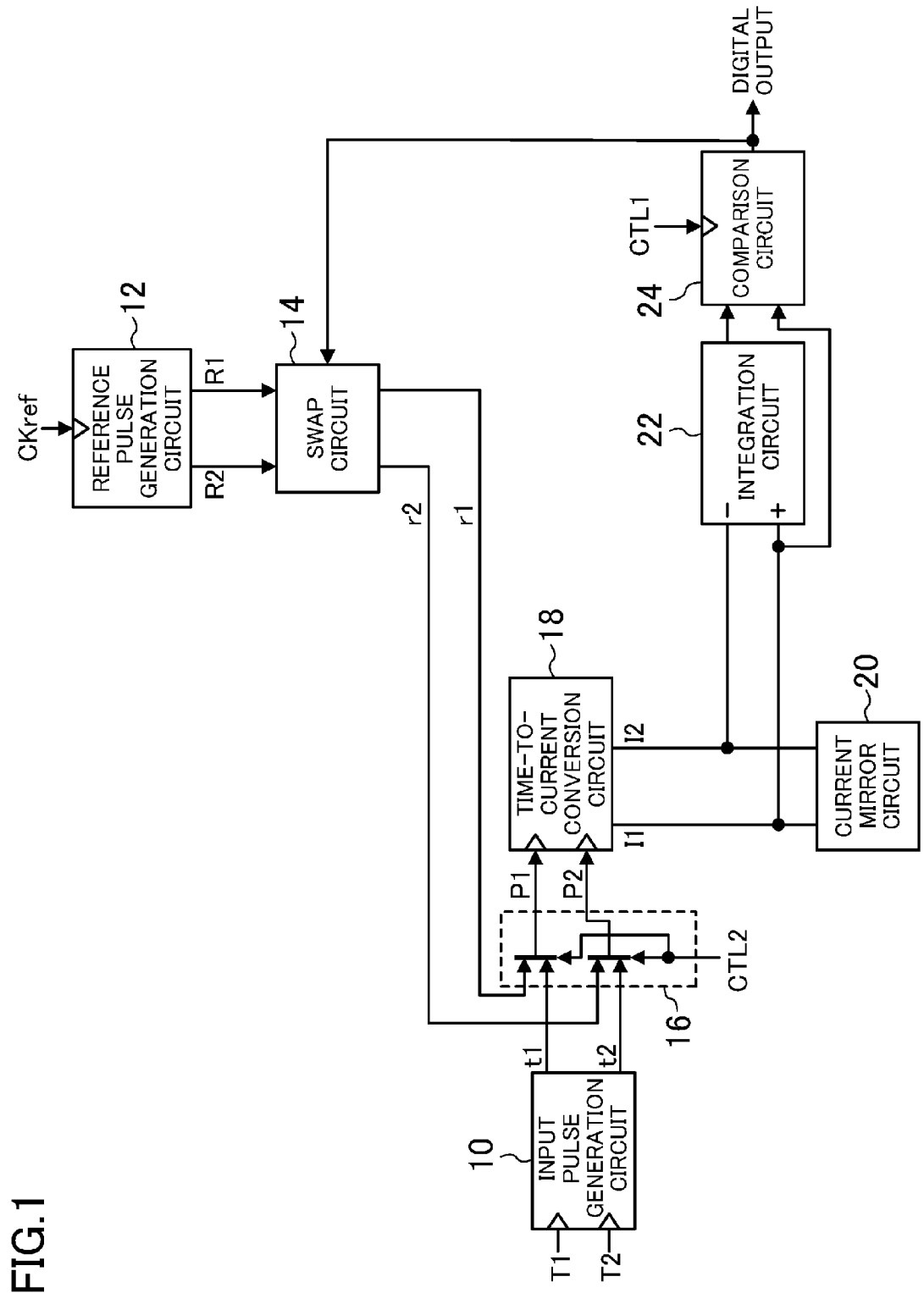
FIG. 1 is a block diagram illustrating a configuration of an oversampling time-to-digital converter according to a first embodiment.

FIG. 1 is a block diagram illustrating a configuration of an oversampling time-to-digital converter according to a first embodiment. The oversampling time-to-digital converter according to this embodiment includes an input pulse generation circuit 10, a reference pulse generation circuit 12, a swap circuit 14, a multiplexer 16, a time-to-current conversion circuit 18, a current mirror circuit 20, an integration circuit 22, and a comparison circuit 24, and converts a time difference between respective edges of input signals T1 and T2 to a digital value by ΔΣ modulation.

The input pulse generation circuit 10 generates two pulse signals t1 and t2 from the input signals T1 and T2 such that the time difference between respective start edges of the pulse signals t1 and t2 is equal to the time difference between the edges of input signals T1 and T2 and respective end edges of the pulse signals t1 and t2 match each other. Note that the edge may be either one of a rising edge and a falling edge.

The reference pulse generation circuit 12 generates two pulse signals R1 and R2 from a reference clock signal CKref such that the time difference between respective start edges of the pulse signals R1 and R2 is equal to a clock cycle of the reference clock signal CKref and respective end edges of the pulse signals R1 and R2 match each other. Note that the edge may be either one of a rising edge and a falling edge.

The swap circuit 14 swaps the pulse signals R1 and R2 output from the reference pulse generation circuit 12 in accordance with an output signal of the comparison circuit 24 and outputs two pulse signals r1 and r2. That is, in accordance with a logic level of the output signal of the comparison circuit 24, (r1, r2)=(R1, R2) and (r1, r2)=(R2, R1) are switched around.

The multiplexer 16 receives the pulse signals t1 and t2 output from the input pulse generation circuit 10 and the pulse signals r1 and r2 output from the swap circuit 14 and selectively outputs as two pulse signals P1 and P2 one of the pair of pulse signals t1 and t2 and the pair of pulse signals r1 and r2 in accordance with a control signal CTL2. That is, in accordance with a logic level of the control signal CTL2, (P1, P2)=(t1, t2) and (P1, P2)=(r1, r2) are switched around.

The time-to-current conversion circuit 18 receives the pulse signals P1 and P2 output from the multiplexer 16 and outputs two pulse current I1 and I2 in accordance with respective pulse widths of the pulse signals P1 and P2. That is, the time-to-current conversion circuit 18 converts a time difference between respective start edges of the pulse signals P1 and P2 to electrical charge information represented by a product of a current amount and the time difference.

The current I1 is connected to an input terminal of the current mirror circuit 20, and the current I2 is connected to an output terminal of the current mirror circuit 20. The current mirror circuit 20 mirrors an input current to generate an output current having the same size as that of the input current, and therefore, a differential current between the pulse currents I1 and I2 is output from the output terminal of the current mirror circuit 20. That is, the electrical charge information is output from the output terminal of the current mirror circuit 20.

The integration circuit 22 integrates the differential current output from the output terminal of the current mirror circuit 20.

The comparison circuit 24 compares the output signal of the integration circuit 22 to a threshold voltage. More specifically, the comparison circuit 24 performs a comparison operation in accordance with a control signal CTL1. The output signal of the comparison circuit 24 corresponds to a ΔΣ modulation output of the time difference between edges of the input signals T1 and T2.

Example configurations of the above-described components will be hereinafter described.

Figure 2:
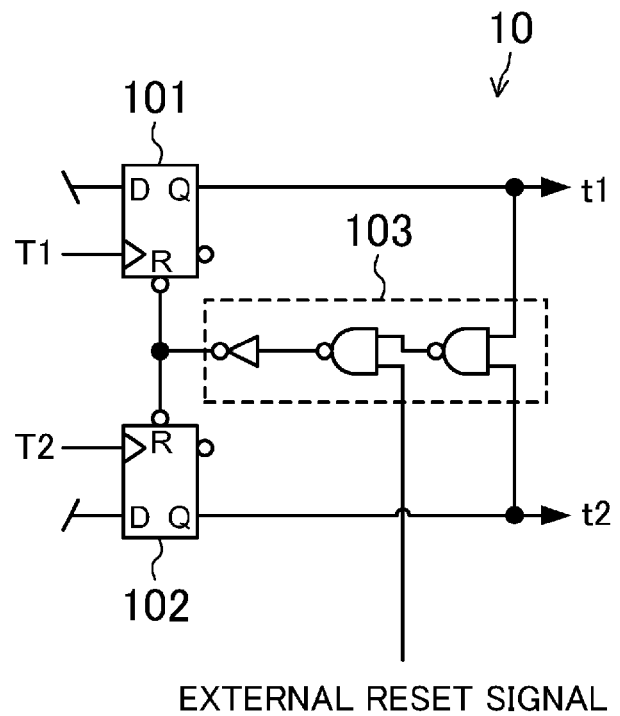
FIG. 2 is a block diagram illustrating a configuration of an input pulse generation circuit.
Figure 3:
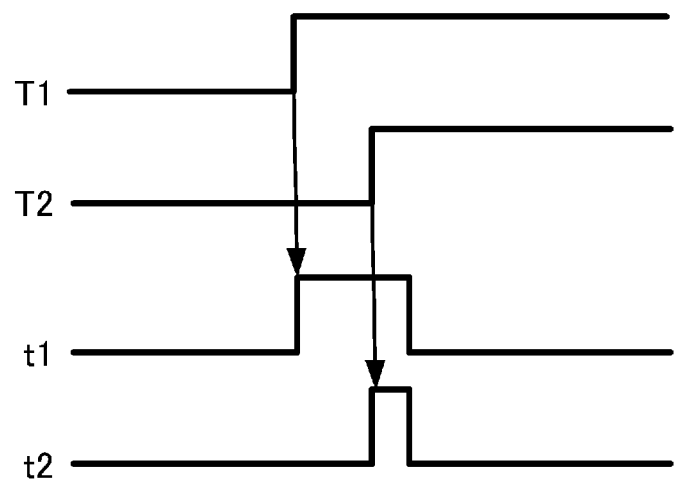
FIG. 3 is a timing chart illustrating input/output signals of the input pulse generation circuit according to the example of FIG. 2.

FIG. 2 is a block diagram illustrating an example configuration of the input pulse generation circuit 10. For example, the input pulse generation circuit 10 may include two flip-flop circuits 101 and 102 and a reset circuit 103. Each of the flip-flop circuits 101 and 102 is a D flip-flop with a reset input, each of the input signals T1 and T2 is connected to an corresponding one of respective clock inputs of the flip-flop circuits 101 and 102, and a power supply voltage is connected to each of respective data inputs of the flip-flop circuits 101 and 102. The reset circuit 103 detects an edge of each of output signals of the flip-flop circuits 101 and 102 to reset the flip-flop circuits 101 and 102. The reset circuit 103 may be configured by combining several logic elements appropriately. The relationship among input and output signals of the input pulse generation circuit 10 is as illustrated in the timing chart of FIG. 3.

Note that, as illustrated in FIG. 2, the reset circuit 103 may be configured to receive an external reset signal to thereby reset the flip-flop circuits 101 and 102 regardless of from which of the flip-flop circuits 101 and 102 an output signal is received.

Figure 4:
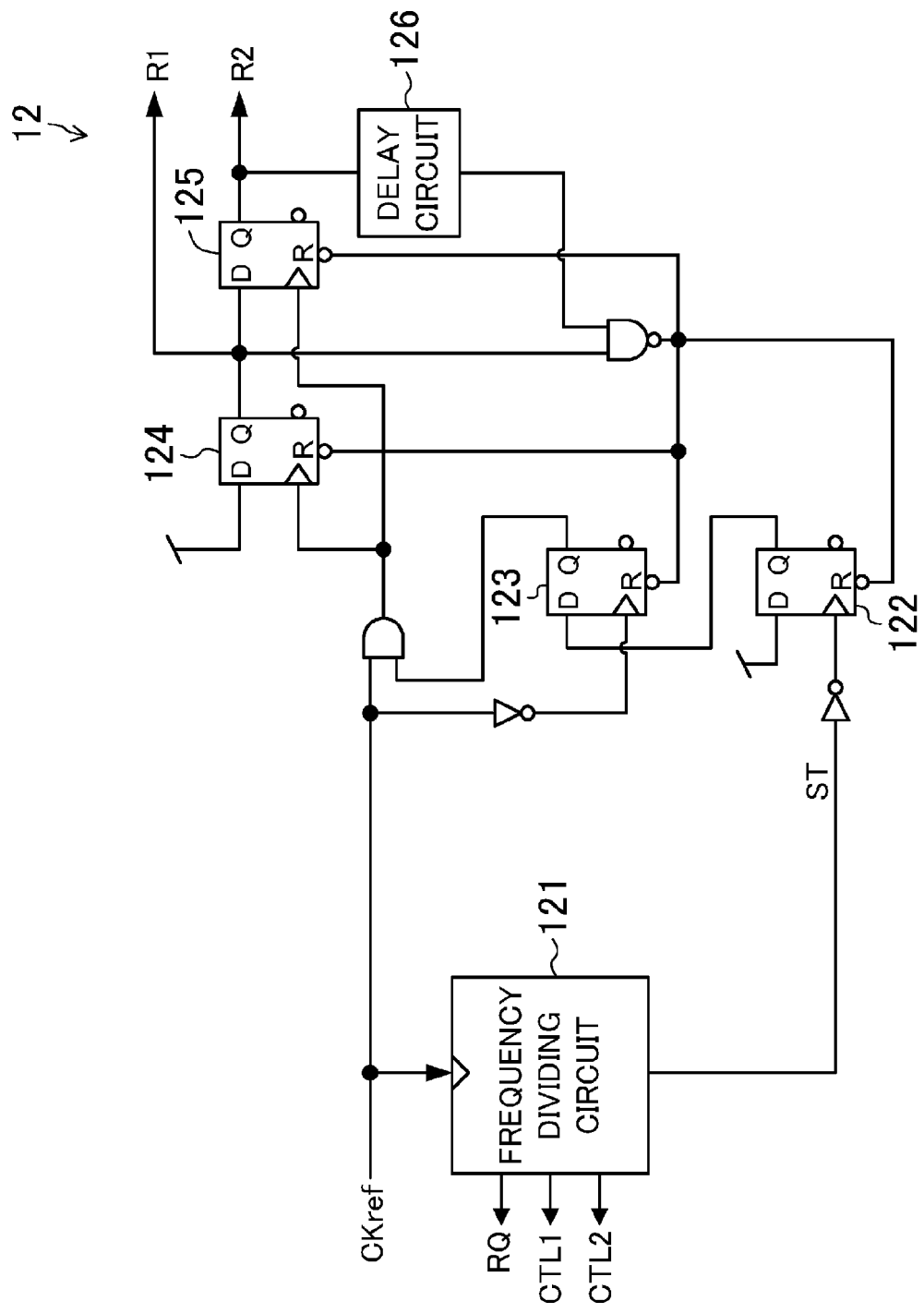
FIG. 4 is a block diagram illustrating a configuration of a reference pulse generation circuit.

FIG. 4 is a block diagram illustrating an example configuration of the reference pulse generation circuit 12. For example, the reference pulse generation circuit 12 may include a frequency dividing circuit 121, four D flip-flops (which will be hereinafter referred to as DFFs) 122, 123, 124, and 125 with a reset input, a delay circuit 126, and several logic elements.

The frequency dividing circuit 121 divides the frequency of the reference clock signal CKref and outputs signals ST, RQ, CTL1, and CTL2. The signal ST is a start signal instructing the generation of the pulse signals R1 and R2. The signal RQ is a request signal requesting a signal source (not illustrated) of each of the input signals T1 and T2 for next signal output. The signals CTL1 and CTL2 are a control signal of the comparison circuit 24 and the multiplexer 16, respectively.

The power supply voltage is connected to a data input of the DFF 122, and an inversion signal of the signal ST is connected to a clock input of the DFF 122. The output signal of the DFF 122 is connected to a data input of the DFF 123, and an inversion signal of the reference clock signal CKref is connected to a clock input of the DFF 123. The power supply voltage is connected to a data input of the DFF 124 and an AND signal of the reference clock signal CKref and the output signal of the DFF 123 is connected to a clock input of the DFF 124. The output signal of the DFF 124 is the pulse signal R1. The output signal of the DFF 124 is connected to a data input of the DFF 125, and an AND signal of the reference clock signal CKref and the output signal of the DFF 123 is connected to a clock input of the DFF 125. The output signal of the DFF 125 is the pulse signal R2. The delay circuit 126 delays the output signal of the DFF 125 and outputs the delayed signal. The DFFs 122-125 are reset by a NAND signal of the output signal of the DFF 124 and the output signal of the delay circuit 126.

Figure 5:
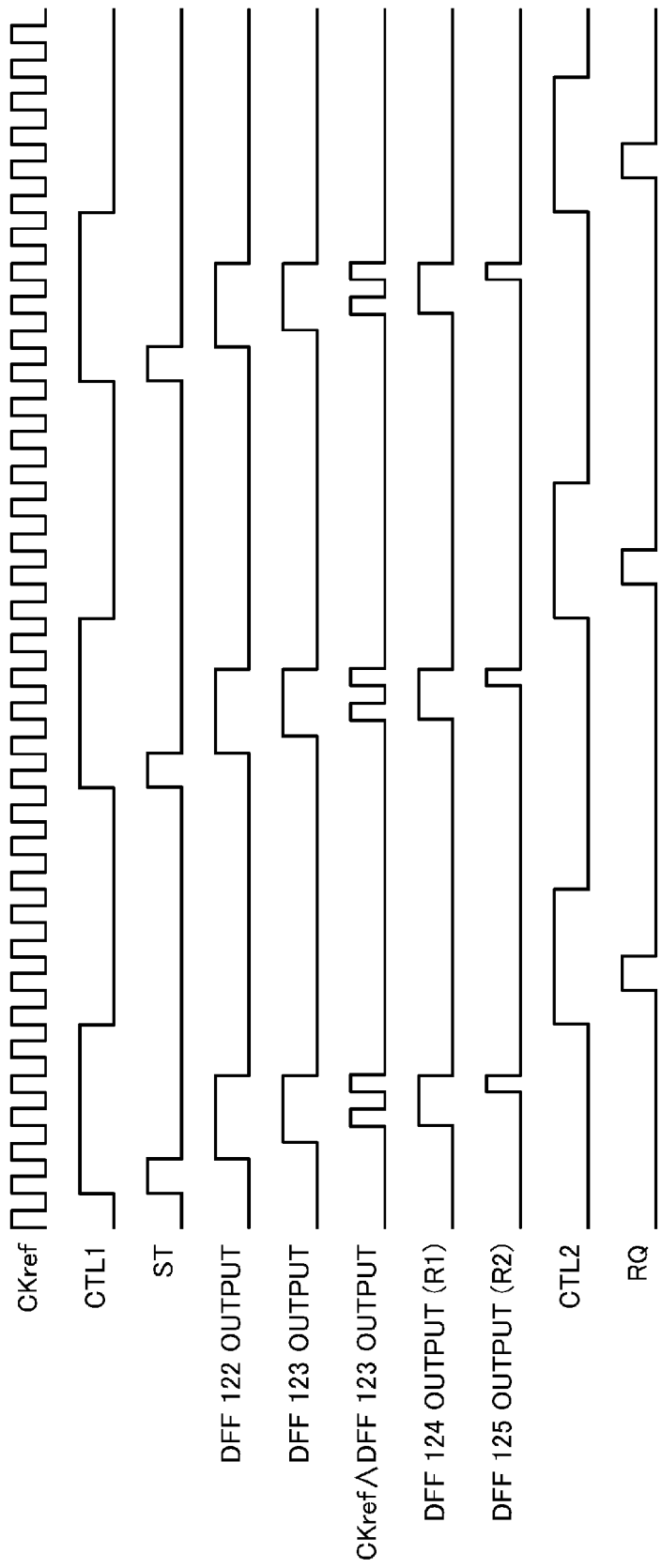
FIG. 5 is a timing chart illustrating various signals of the reference pulse generation circuit according to the example of FIG. 4.

FIG. 5 is a timing chart illustrating various signals of the reference pulse generation circuit 12 according to the example of FIG. 4. After the signal ST is generated, the output signals DFFs 122-125 sequentially transition to "H" and the pulse signals R1 and R2 are generated. In this case, the time difference between the start edges of the pulse signals R1 and R2 is equal to the cycle of the reference clock signal CKref, and the end edges of the pulse signals R1 and R2 match each other. For example, when the frequency of the reference clock signal CKref is 1 GHz, the pulse signals R1 and R2 are generated such that the time difference between the start edges is 1 ns. The control signal CTL1 transitions to "H" in a timing of the generation of the signal ST. The comparison circuit 24 performs a comparison operation at a rising edge of the control signal CTL1. The control signal CTL2 stays at "L" while the pulse signals R1 and R2 are generated, and transitions to "H" after several clocks from each of the end edges of the pulse signals R1 and R2. The multiplexer 16 outputs, when the control signal CTL2 is "L," the pulse signals r1 and r2 and outputs, when the control signal CTL2 is "H," the pulse signals t1 and t2. The signal RQ is generated in an appropriate timing during a period in which the control signal CTL2 is "H."

Note that, in the example of FIG. 5, the cycle of each of the signals ST, RQ, CTL1, and CTL2 is twelve times the cycle of the reference clock signal CKref, but the frequency dividing number is not limited to twelve.

Figure 6:
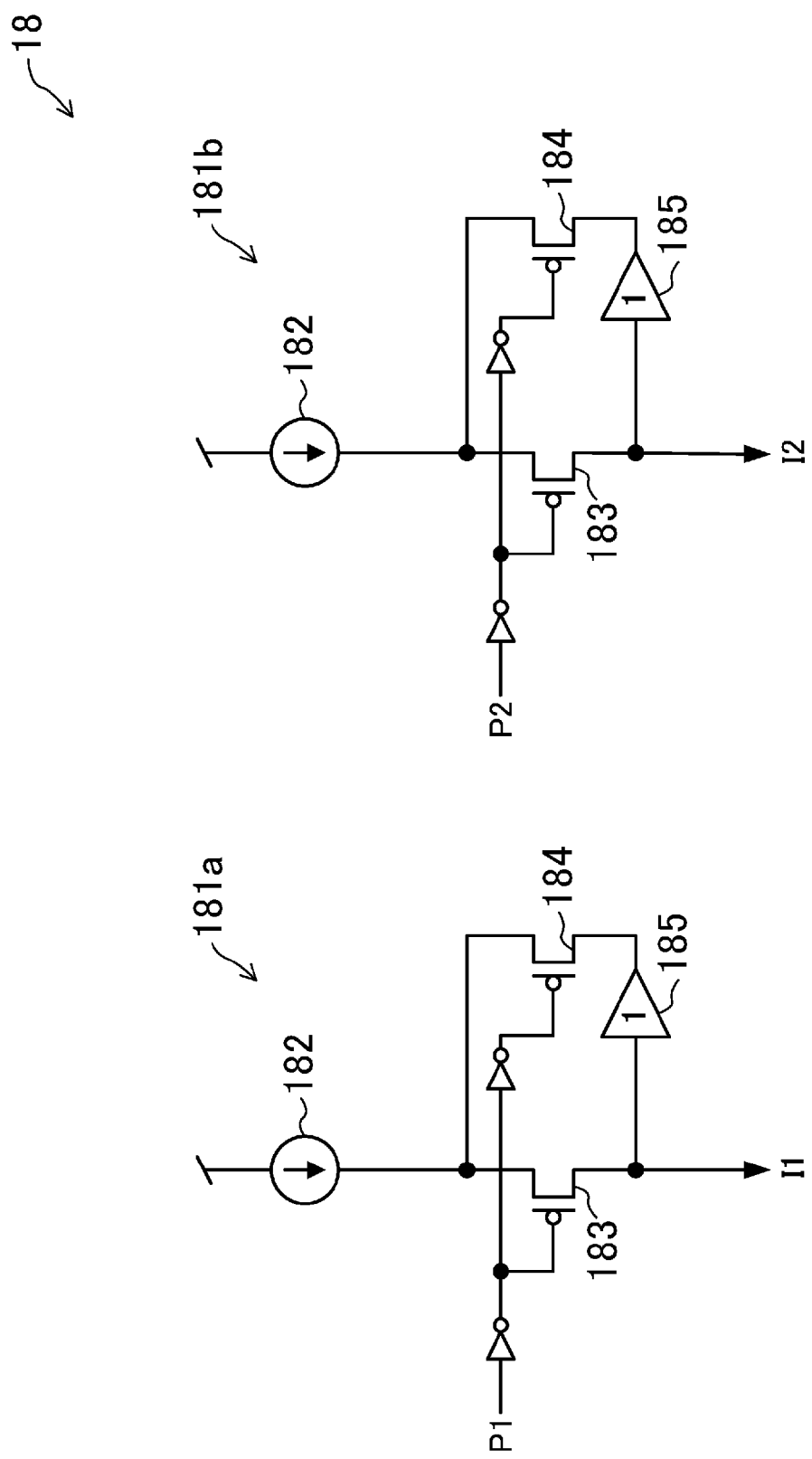
FIG. 6 is a block diagram illustrating a configuration of a time-to-current conversion circuit.

FIG. 6 is a block diagram illustrating an example configuration of the time-to-current conversion circuit 18. For example, the time-to-current conversion circuit 18 includes a pulse current generation circuit 181a configured to generate the pulse current I1 in accordance with the pulse width of the pulse signal P1 and a pulse current generation circuit 181b configured to generate the pulse current I2 in accordance with the pulse width of the pulse signal P2. The two pulse current generation circuit 181a and 181b have the same configuration, and therefore, the pulse current generation circuit 181a will be hereinafter described representatively.

The pulse current generation circuit 181a may include an electric current source 182, two switch elements 183 and 184, and a voltage buffer circuit 185. Each of the switch elements 183 and 184 may be made of, for example, a PMOS transistor. The switch element 183 has a source connected to an output terminal of the electric current source 182, receives an inversion signal of the pulse signal P1 at a gate thereof, and outputs the pulse current I1 from a drain thereof. The switch element 184 has a source also connected to the output terminal of the electric current source 182 and receives an inversion signal of a signal input to the gate of the switch element 183 at a gate thereof. The drain of the switch element 183 is connected to an input terminal of the voltage buffer circuit 185 and the drain of the switch element 184 is connected to an output terminal of the voltage buffer circuit 185. That is, the drains of the switch elements 183 and 184 are connected to each other via the voltage buffer circuit 185 to thereby keep voltages of the drains equal to each other.

When the pulse signal P1 is "H," the switch element 183 is conductive, the switch element 184 is nonconductive, and a current supplied from the electric current source 182 is output as the pulse current I1 via the switch element 183. On the other hand, when the pulse signal P1 is "L," the switch element 183 is nonconductive, the switch element 184 is conductive, and a current supplied from the electric current source 182 flows into the output terminal of the voltage buffer circuit 185 via the switch element 184. That is, the switch element 184 and the voltage buffer circuit 185 function as a dummy path which causes, even when the switch element 183 is nonconductive, the current of the electric current source 182 to continuously flow. Due to the effect of the dummy path, when viewed from the electric current source 182, apparently, a load does not change even when one of the switch elements 183 and 184 is conductive, and therefore, current accuracy is not deteriorated even when the switch elements 183 and 184 are switched around at high speed. Thus, the time-to-current conversion circuit 18 may convert the time difference between the start edges of the pulse signals P1 and P2 to the electrical charge information with high accuracy.

Note that the switch element 184 and the voltage buffer circuit 185 do not have to be provided. When the current accuracy is not required, the switch element 184 and the voltage buffer circuit 185 may be omitted.

Figure 7:
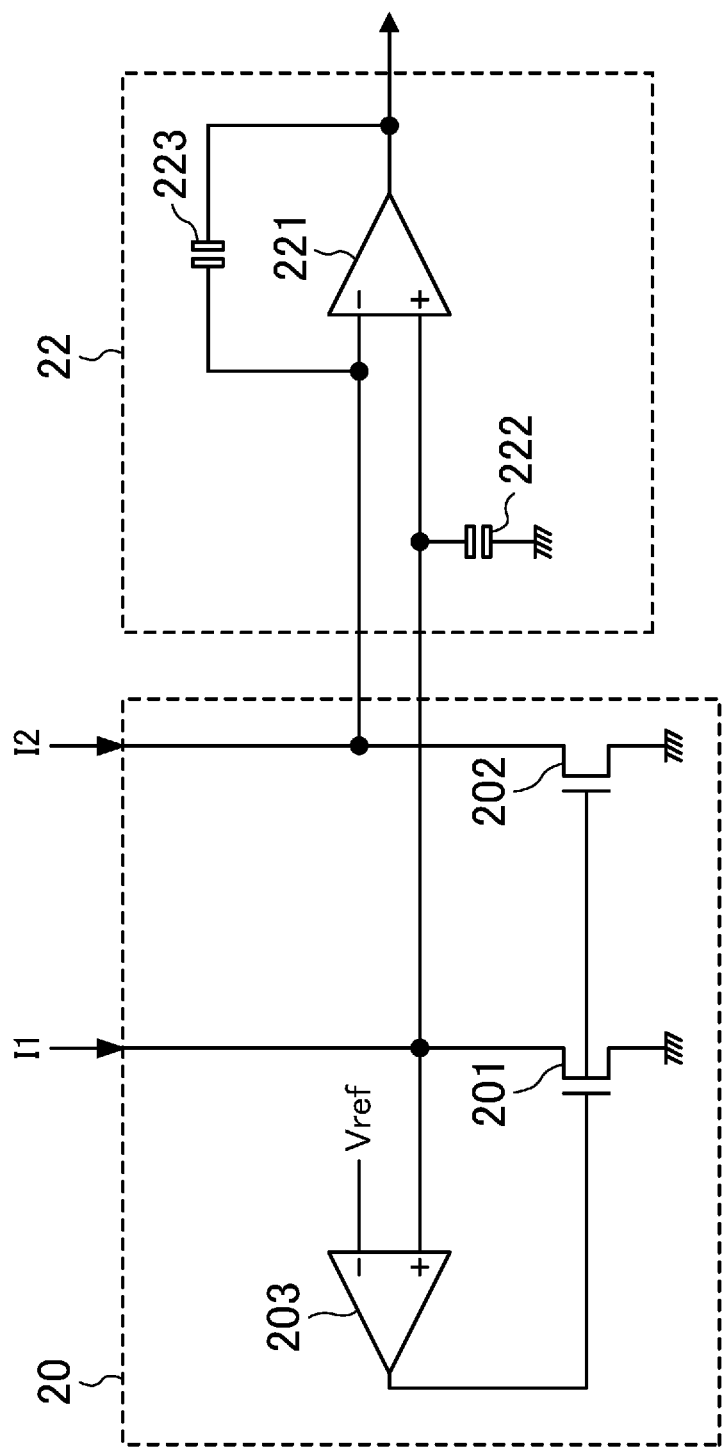
FIG. 7 is a block diagram illustrating a configuration of a current mirror circuit and an integration circuit.

FIG. 7 is a block diagram illustrating an example configuration of the current mirror circuit 20 and the integration circuit 22. For example, the current mirror circuit 20 may include two transistors 201 and 202 and an operation amplifier 203. Each of the transistors 201 and 202 is an NMOS transistor. The operation amplifier 203 is configured such that a positive phase input terminal thereof is connected to a drain of the transistor 201, a reference voltage Vref is connected to a negative phase terminal thereof and an output terminal thereof is connected to a gate of the transistor 201. The gates of the transistors 201 and 202 are connected to each other. That is, the transistors 201 and 202 generate an input current and an output current of the current mirror circuit 20, respectively.

In the current mirror circuit 20 according to the example of FIG. 7, the positive phase input terminal and the negative phase input terminal of the operation amplifier 203 are virtually short-circuited to thereby keep the voltage of the drain of the transistor 201 at the reference voltage Vref. Thus, the transistors 201 and 202 may be operated at a more stable operating point to generate an output current with higher accuracy.

For example, the integration circuit 22 may include an operation amplifier 221 and two capacitive elements 222 and 223. A negative phase input terminal of the operation amplifier 221 is connected to an output terminal of the current mirror circuit 20 and a positive phase input terminal is connected to an input terminal of the current mirror circuit 20. The capacitive element 222 is connected between the positive phase input terminal of the operation amplifier 221 and a common node. The capacitive element 223 is connected between the negative phase input terminal of the operation amplifier 221 and the output terminal.

In this case, when it is assumed that a transconductance value of the transistors 201 and 202 is Gm, a gain of the operation amplifier 203 is A1, a gain of the operation amplifier 221 is A2, a capacitance value of the capacitive element 222 is C1, a capacitance value of the capacitive element 223 is C2, a gate voltage of the transistors 201 and 202 is V1, an input terminal voltage of the current mirror circuit 20 is V2, an output terminal voltage of the current mirror circuit 20 is V3, and an output voltage of the integration circuit 22 is Vo, the following nodal equation holds. Note that s in the equation is a Laplace operator.

$$\begin{cases} -I_1 + V_1 G_m + V_2 s C_1 = 0 \\ -I_2 + V_1 G_m + (V_3 - V_o) s C_2 = 0 \\ V_1 = A_1 V_2 \\ V_o = A_2 (V_2 - V_3) \end{cases} \quad \text{[Expression 1]}$$

Under the condition of C2=C1, when the nodal equation is solved for Vo, the following expression is obtained.

$$V_o = \frac{(I_1 - I_2) A_2}{(1 + A_2) s C_1} \quad \text{[Expression 2]}$$

In Expression 2, parameters, such as Gm and A1, etc., relating to the current mirror circuit 20 are not included. That is, integral characteristics of the integration circuit 22 do not depend on frequency characteristics of the current mirror circuit 20 but are determined by the gain of the operation amplifier 221 which is a component of the integration circuit 22 and the capacitance value of the capacitive elements 222 and 223 which are also components of the integration circuit 22. Thus, the differential current between the pulse currents I1 and I2 may be integrated with very high accuracy by the current mirror circuit 20 and the integration circuit 22 according to the example of FIG. 7.

Figure 8:
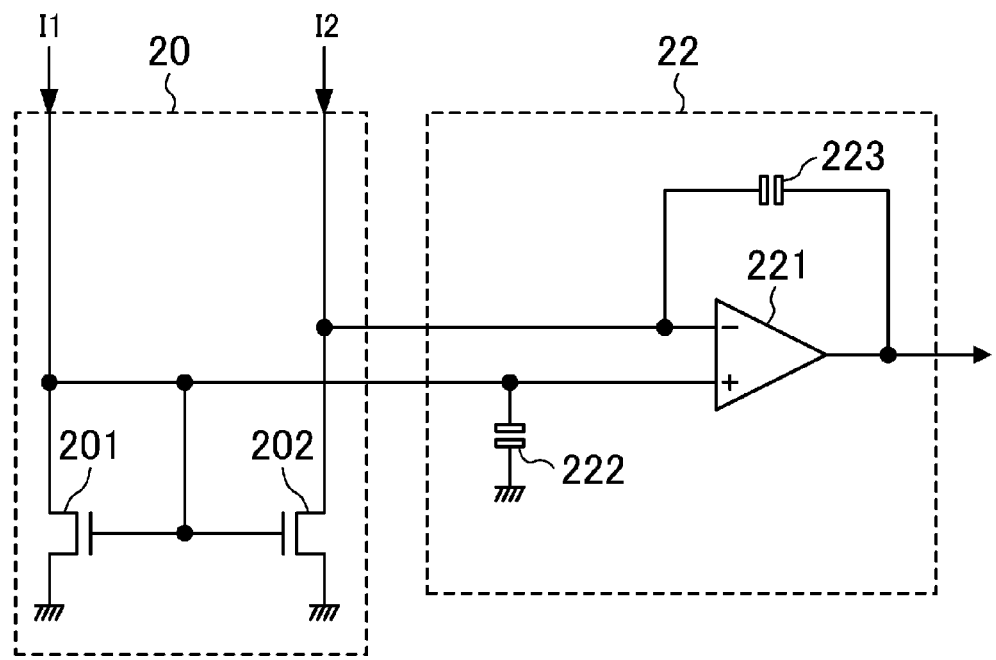
FIG. 8 is a block diagram illustrating a configuration of a current mirror circuit according to another example.

Note that, if accuracy is not required for an output current generated by the current mirror circuit 20, the operation amplifier 203 may be omitted from the current mirror circuit 20. For example, as illustrated in FIG. 8, the current mirror circuit 20 may merely include the transistors 201 and 202.

Figure 9:
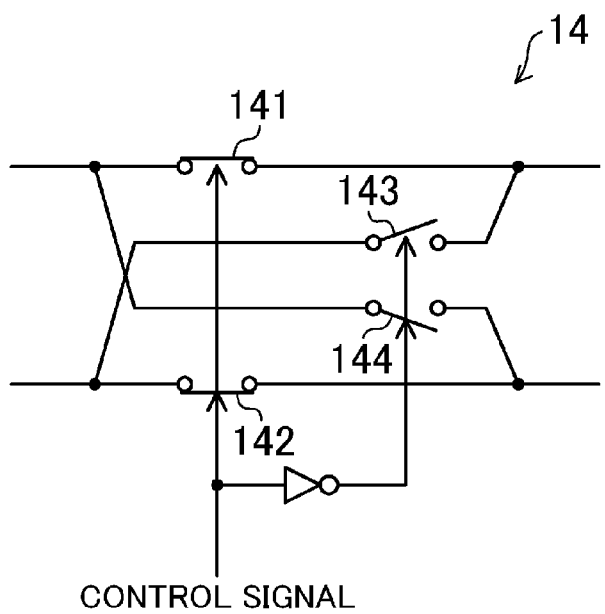
FIG. 9 is a block diagram illustrating a configuration of a swap circuit.

FIG. 9 is a block diagram illustrating an example configuration of the swap circuit 14. For example, the swap circuit 14 may include four switch elements 141, 142, 143, and 144.

As described above, using the oversampling time-to-digital converter according to this embodiment, the time difference between edges of the input signals T1 and T2 may be ΔΣ modulated. Thus, the time difference between edges of the input signals T1 and T2 may be digital converted within a range of ±T (where T is the cycle of the reference clock signal CKref) with high accuracy.

Second Embodiment

Figure 10:
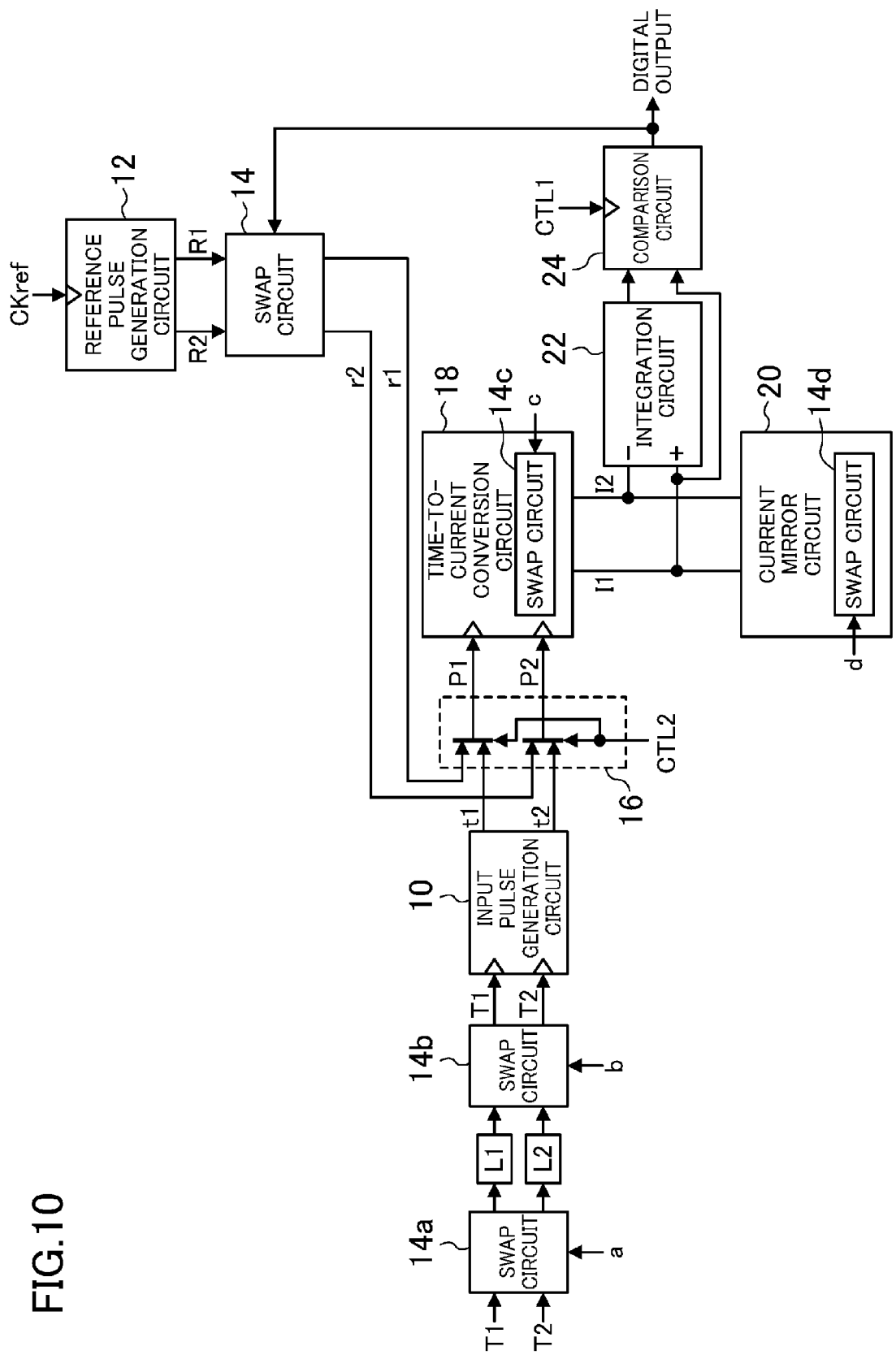
FIG. 10 is a block diagram illustrating a configuration of an oversampling time-to-digital converter according to a second embodiment.

FIG. 10 is a block diagram illustrating a configuration of an oversampling time-to-digital converter according to a second embodiment. The oversampling time-to-digital converter according to this embodiment is obtained by adding swap circuits 14a, 14b, 14c, and 14d to the oversampling time-to-digital converter according to the first embodiment. The oversampling time-to-digital converter according to this embodiment will be described with focus on differences from that of the first embodiment.

Input signals T1 and T2 are output from signal sources (not illustrated) and are received by the input pulse generation circuit 10 via signal paths L1 and L2, respectively. The swap circuit 14a is inserted at an output side of the signal sources (not illustrated). The swap circuit 14b is inserted at an input side of the input pulse generation circuit 10. Each of the swap circuits 14a and 14b swaps the input two signals in accordance with control signals a and b and outputs the signals. Similar to the example of FIG. 9, each of the swap circuits 14a and 14b may include the four switches 141, 142, 143, and 144.

By controlling both of the swap circuits 14a and 14b together, the signal paths L1 and L2 can be swapped. For example, when each of the control signals a and b is "1," the input signals T1 and T2 output from the signal sources (not illustrated) are received by the input pulse generation circuit 10 via the signals paths L1 and L2, respectively. On the other hand, when each of the control signals a and b is "0," the input signals T1 and T2 output from the signal sources (not illustrated) are received by the input pulse generation circuit 10 via the signals paths L2 and L1, respectively.

The swap circuit 14c swaps the input two signals in accordance with a control signal c and outputs the signals. By controlling both of the swap circuits 14b and 14c together, respective electric current sources of the pulse currents I1 and I2 output from the time-to-current conversion circuit 18 can be swapped.

Figure 11:
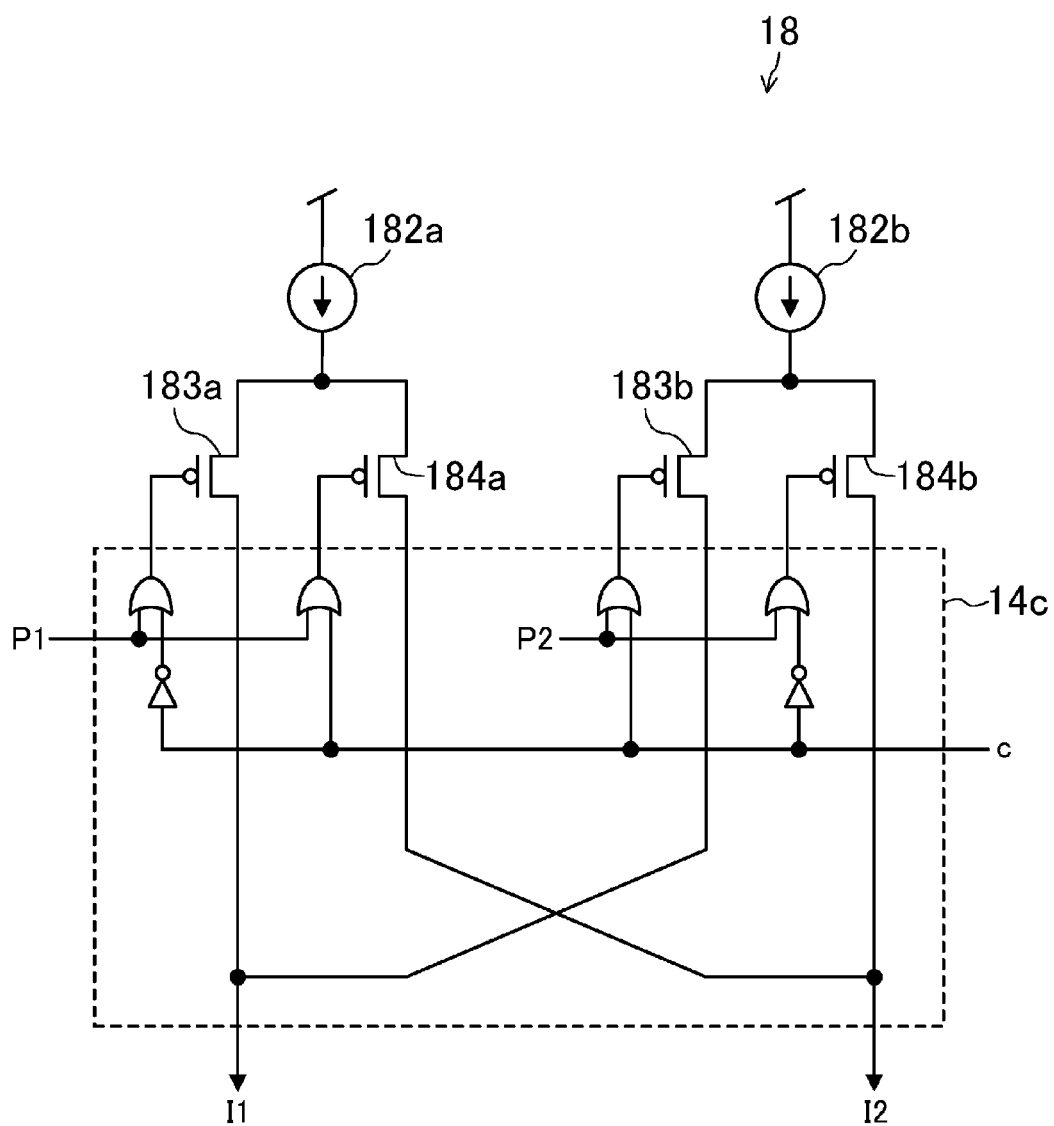
FIG. 11 is a diagram illustrating a configuration of a time-to-current conversion circuit and a swap circuit.

FIG. 11 is a diagram illustrating an example configuration of the time-to-current conversion circuit 18 and the swap circuit 14c. For example, the time-to-current conversion circuit 18 may include two electric current sources 182a and 182b and four switch elements 183a, 183b, 184a, and 184b. Each of the switch elements 183a, 183b, 184a, and 184b may be made of a PMOS transistor. Sources of the switch elements 183a and 184a are connected to an output terminal of the electric current source 182a and sources of the switch element 183b and 184b are connected to an output terminal of the electric current source 182b. The swap circuit 14c inputs an OR signal of the pulse signal P1 and an inversion signal of the control signal c to a gate of the switch element 183a, an OR signal of the pulse signal P1 and the control signal c to a gate of the switch element 184a, an OR signal of the pulse signal P2 and the control signal c to a gate of the switch element 183b, and an OR signal of the pulse signal P2 and an inversion signal of the control signal c to a gate of the switch element 184b.

For example, when the control signal c is "1," the switch elements 183b and 184a are nonconductive, the switch element 183a is switching-controlled in accordance with the pulse signal P1, and a current of the electric current source 182a is output as the pulse current I1. The switch element 184b is switching-controlled in accordance with the pulse signal P2, and a current of the electric current source 182b is output as the pulse current I2. On the other hand, when the control signal c is "0," the switch elements 183a and 184b are nonconductive, the switch element 183b is switching-controlled in accordance with the pulse signal P2, and a current of the electric current source 182b is output as the pulse current I1. The switch element 184a is switching-controlled in accordance with the pulse signal P1, and a current of the electric current source 182a is output as the pulse current I2. That is, the swap circuit 14c swaps the pulse current I1 and I2 in accordance with the control signal c.

When the control signal c is "0," the control signal b is also caused to be "0" to swap the input signals T1 and T2 in the swap circuit 14b and thus the pulse signals P1 and P2 are swapped, so that the electric current sources 182a and 182b are substantially swapped. That is, the switch element 183b is switching-controlled in accordance with the pulse signal P1 to cause the current of the electric current source 182b to be output as the pulse current I1, and the switch element 184a is switching-controlled in accordance with the pulse signal P2 to cause the current of the electric current source 182a to be output as the pulse current I2.

The swap circuit 14d swaps the input two signals in accordance with a control signal d and outputs the signals. By controlling both of the swap circuits 14c and 14d together, the transistor which generates an input current of the current mirror circuit 20 and the transistor which generates an output current of the current mirror circuit 20 can be swapped.

Figure 12:
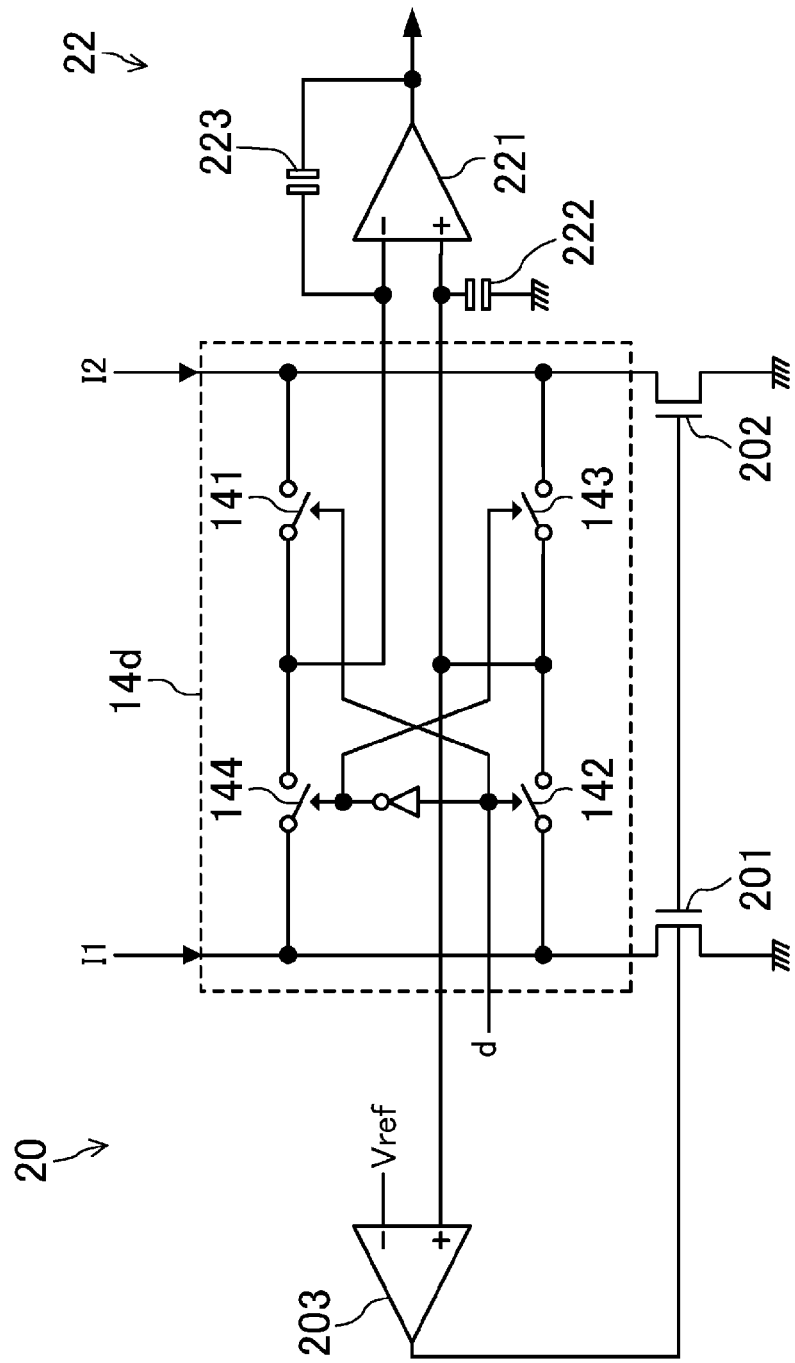
FIG. 12 is a block diagram illustrating a configuration of a current mirror circuit, a swap circuit, and an integration circuit.

FIG. 12 is a block diagram illustrating an example configuration of the current mirror circuit 20 and the swap circuit 14d. Similar to the example of FIG. 7, the current mirror circuit 20 may include the two transistors 201 and 202 and the operation amplifier 203. Similar to the example of FIG. 7, the integration circuit 22 may include the operation amplifier 221 and the two capacitive elements 222 and 223. Similar to the example of FIG. 9, the swap circuit 14d may include the four switching elements 141, 142, 143, and 144.

For example, when the control signal d is "1," the switch elements 141 and 142 are conductive, the switch elements 143 and 144 are nonconductive, the drain of the transistor 201 is connected to the positive phase input terminals of the operation amplifiers 203 and 221, and the drain of the transistor 202 is connected to the negative phase input terminal of the operation amplifier 221. On the other hand, when the control signal d is "0," the switch elements 141 and 142 are nonconductive, the switch elements 143 and 144 are conductive, the drain of the transistor 202 is connected to the positive phase input terminals of the operation amplifiers 203 and 221, and the drain of the transistor 201 is connected to the negative phase input terminal of the operation amplifier 221.

In the current mirror circuit 20, the pulse current I1 is connected to the drain of the transistor 201 and the pulse current I2 is connected to the drain of the transistor 202. Therefore, when the control signal d is "0," the control signal c is caused to be "0" and thereby swap the pulse currents I1 and I2 in the swap circuit 14c, and thus the pulse currents I1 and I2 connected to the drains of the transistors 201 and 202 are swapped, so that the transistors 201 and 202 are substantially swapped. That is, the pulse current I1 is connected to the drain of the transistor 202 to thereby generate an input current of the current mirror circuit 20, and the pulse current I2 is connected to the drain of the transistor 201 to thereby generate an output current of the current mirror circuit 20.

As described above, the swap circuits 14a-14d are appropriately controlled, and thus, swapping of the signal paths L1 and L2, swapping of the electric current sources 182a and 182b, and swapping of the transistors 201 and 202 can be independently performed.

Incidentally, signal delay amounts of the signal path L1 and L2 are not completely the same but there is a slight difference in delay therebetween. In this case, it is assumed that the signal delay amount of the signal path L2 is greater than the signal delay amount of the signal path L1 by D. There is also a slight difference in electric current between the electric current sources 182a and 182b. In this case, it is assumed that respective sizes of the currents supplied by the electric current sources 182a and 182b are denoted by Ia and Ib, respectively. Since there is a slight difference in characteristic between the transistors 201 and 202, the current mirror ratio of the current mirror circuit 20 is not exactly 1:1. In this case, it is assumed that the current mirror ratio of the current mirror circuit 20 is 1:1−α.

Due to the delay error D for the signal paths L1 and L2, an electric current error Ia−Ib for the electric current sources 182a and 182b, and a current ratio error a for the current mirror circuit 20, time-to-digital conversion accuracy is deteriorated. Thus, the errors are cancelled by appropriately controlling the swap circuits 14a-14d and thereby performing swapping of the signal paths L1 and L2, swapping of the electric current sources 182a and 182b, and swapping of the transistors 201 and 202.

For example, the swap circuits 14a-14b are controlled in accordance with the following table, and thus, eight different differential currents in consideration of all combinations of the above-described errors may be obtained.

TABLE 1

| a | b | c | d | RELATIVE ERROR FOR t1 and t2 | SIZES OF I1 AND I2 | CURRENT MIRROR COEFFICIENT | DIFFERENTIAL CURRENT (ELECTRICAL CHARGE INFORMATION) |
|---|---|---|---|---|---|---|---|
| 1 | 1 | 1 | 1 | +D | Ia, Ib | 1 − α | (t1 + D) * Ia * (1 − α) − t2 * Ib |
| 1 | 1 | 0 | 0 | +D | Ia, Ib | 1 + α | (t1 + D) * Ia * (1 + α) − t2 * Ib |
| 1 | 0 | 0 | 1 | +D | Ib, Ia | 1 − α | (t1 + D) * Ib * (1 − α) − t2 * Ia |
| 1 | 0 | 1 | 0 | +D | Ib, Ia | 1 + α | (t1 + D) * Ib * (1 + α) − t2 * Ia |
| 0 | 0 | 1 | 1 | −D | Ia, Ib | 1 − α | t1 * Ia * (1 − α) − (t2 + D) * Ib |
| 0 | 0 | 0 | 0 | −D | Ia, Ib | 1 + α | t1 * Ia * (1 + α) − (t2 + D) * Ib |
| 0 | 1 | 0 | 1 | −D | Id, Ia | 1 − α | t1 * Ib * (1 − α) − (t2 + D) * Ia |
| 0 | 1 | 1 | 0 | −D | Ib, Ia | 1 + α | t1 * Ib * (1 + α) − (t2 + D) * Ia |

In Table 1, t1 and t2 indicate the pulse widths of pulse signals t1 and t2, respectively. A "current mirror coefficient" indicates the ratio of the output current of the current mirror circuit 20 to the input current thereof. Although, in a strict sense, when the transistors 201 and 202 in the current mirror circuit 20 are swapped, the current mirror coefficient is 1/(1−α), 1/(1−α)≈1+α holds if α is sufficiently smaller than 1, and therefore, the current mirror coefficient when the transistors 201 and 202 are swapped is set to be 1+α in this case.

When all of eight different differential currents are summed up, 4(t1−t2)(Ia+Ib) is obtained. That is, the delay error D for the signal paths L1 and L2, the electric current error Ia−Ib for the electric current sources 182a and 182b, and the current mirror ratio error a for the current mirror circuit 20 are all cancelled by integrating the eight differential currents by the integration circuit 22.

As described above, using the oversampling time-to-digital converter according to this embodiment, the delay error for the signal paths L1 and L2, the electric current error for the electric current sources 182*a* and 182*b*, and the current mirror ratio error for the current mirror circuit 20 can be automatically cancelled without calibration. Thus, higher accurate time-to-digital conversion is enabled.

Note that not all but one or more of the delay error for the signal paths L1 and L2, the electric current error for the electric current source 182*a* and 182*b*, and the current mirror ratio error for the current mirror circuit 20 may be a cancellation target. In such a case, unnecessary one or more of the swap circuits 14*a*-14*d* may be omitted.

Third Embodiment

Figure 13:
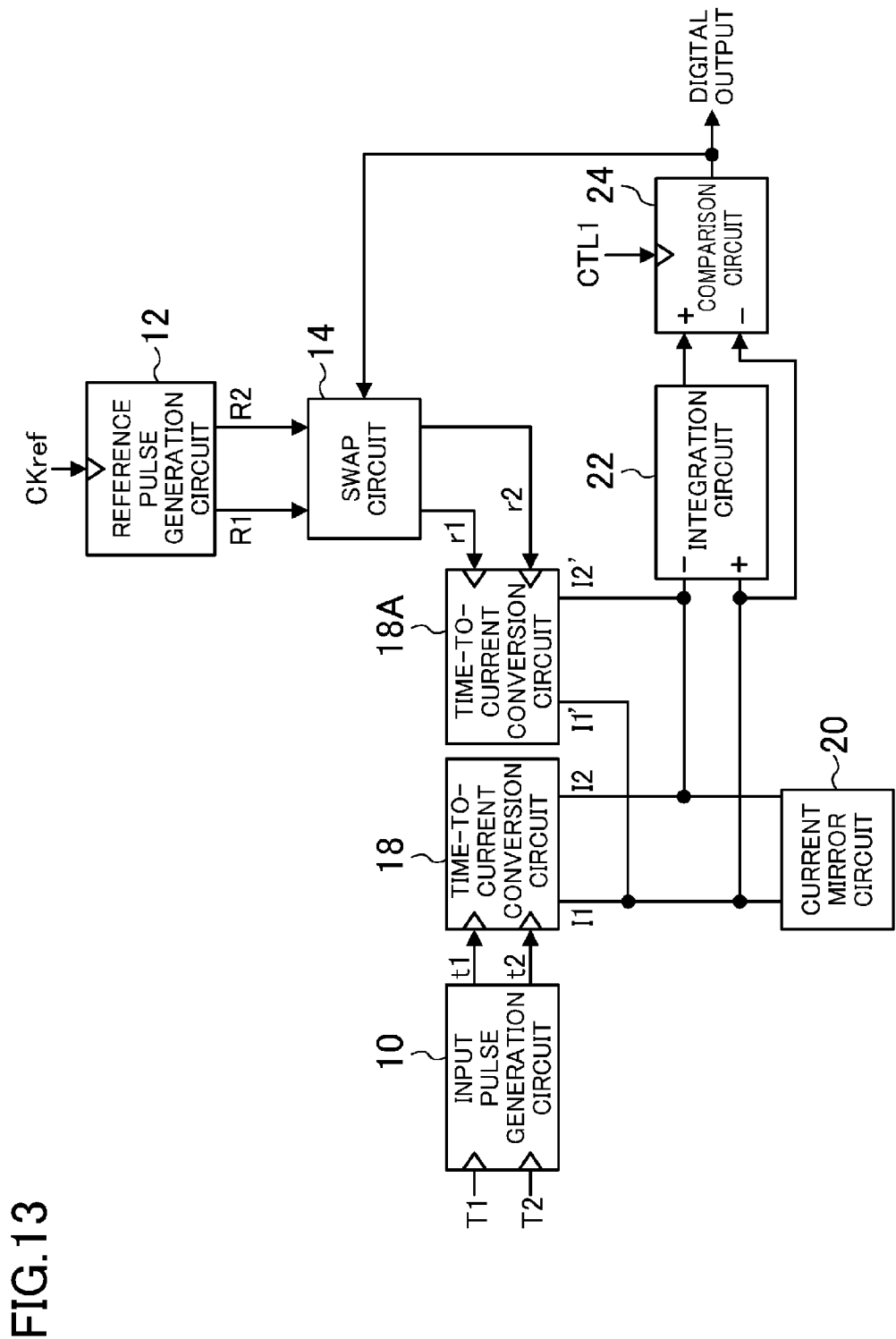
FIG. 13 is a block diagram illustrating a configuration of an oversampling time-to-digital converter according to a third embodiment.

FIG. 13 is a block diagram illustrating a configuration of an oversampling time-to-digital converter according to a third embodiment. The oversampling time-to-digital converter according to this embodiment is obtained by omitting the multiplexer 16 in the oversampling time-to-digital converter according to the first embodiment to cause the pulse signals t1 and t2 to be input to the time-to-current conversion circuit 18 and furthermore adding a time-to-current conversion circuit 18A. The oversampling time-to-digital converter according to this embodiment will be hereinafter described with focus on differences from that of the first embodiment.

The time-to-current conversion circuit 18A receives pulse signals r1 and r2 from the swap circuit 14 and outputs two pulse currents I1' and I2' in accordance with respective pulse widths of the pulse signals r1 and r2, respectively. The time-to-current conversion circuit 18A may be configured as illustrated in the example of FIG. 6.

The pulse currents I1 and I1' are connected to the input terminal of the current mirror circuit 20, and the pulse current I2 and I2' are connected to the output terminal of the current mirror circuit 20. The current mirror circuit 20 mirrors an input current to generate an output current having the same size as that of the input current, and therefore, a differential current between the pulse currents I1+I1' and I2+I2' is output from the output terminal of the current mirror circuit 20.

As described above, the integration circuit 22 integrates the differential current output from the output terminal of the current mirror circuit 20, and the comparison circuit 24 controls the swap circuit 14 in accordance with a result of comparison of the output signal of the integration circuit 22 to a threshold voltage.

Thus, as described above, using the oversampling time-to-digital converter according to this embodiment, the time difference between edges of the input signals T1 and T2 can be ΔΣ modulated. Thus, the time difference between edges of the input signals T1 and T2 can be digital converted with high accuracy within a range of ±T (where T is the cycle of the reference clock signal CKref).

Fourth Embodiment

Figure 14:
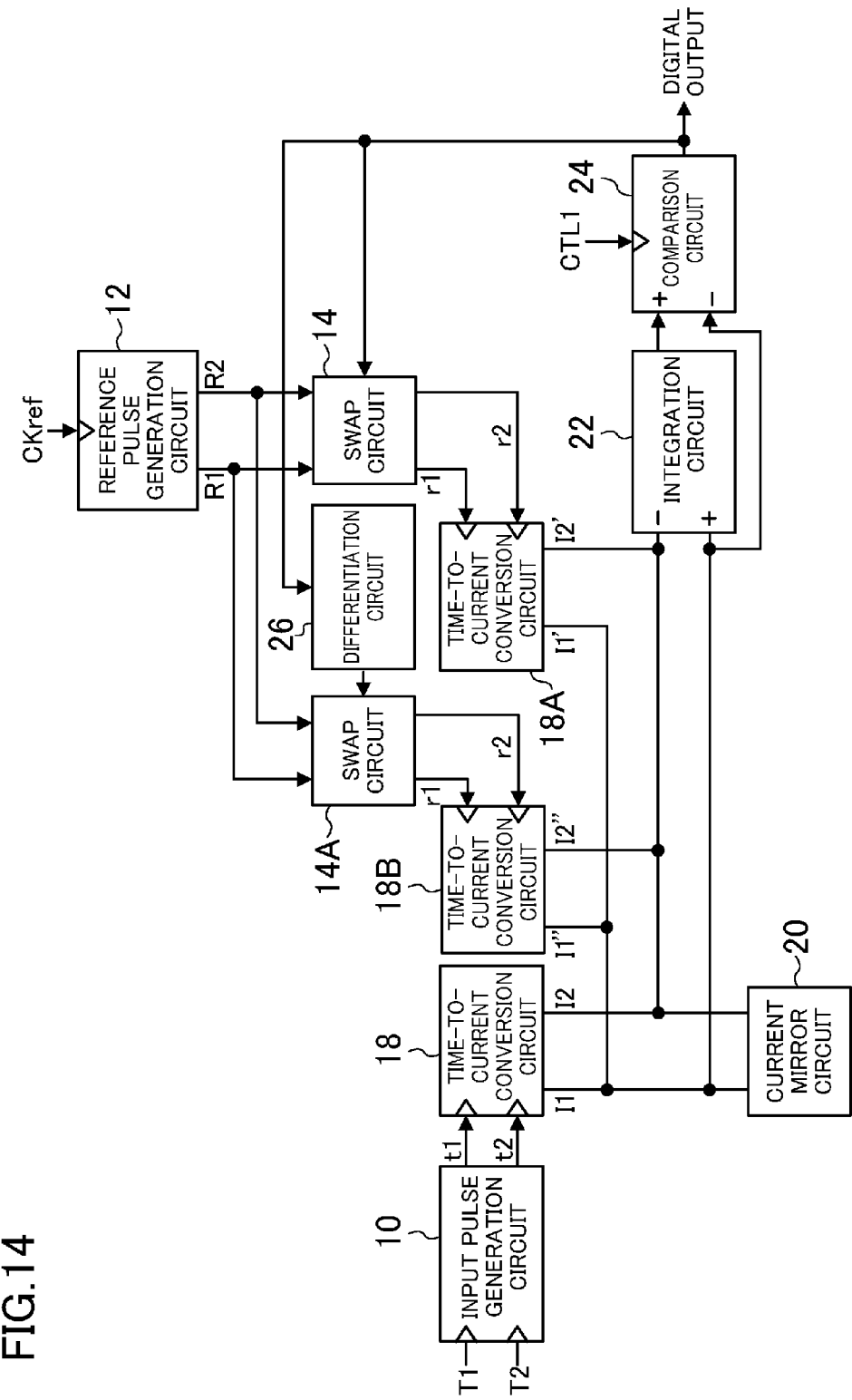
FIG. 14 is a block diagram illustrating a configuration of an oversampling time-to-digital converter according to a fourth embodiment.

FIG. 14 is a block diagram illustrating a configuration of an oversampling time-to-digital converter according to a fourth embodiment. The oversampling time-to-digital converter according to this embodiment is obtained by forming the integration circuit 22 in the oversampling time-to-digital converter according to the third embodiment into a second-order integration circuit and furthermore adding a differentiation circuit 26, a swap circuit 14A, and a time-to-current conversion circuit 18B. The oversampling time-to-digital converter according to this embodiment will be hereinafter described with focus on differences from that of the third embodiment.

The integration circuit 22 is a second-order integrator. Normally, in a second-order ΔΣ AD converter, in addition to second-order integration, a first-order integral value needs to be fed back in order to ensure stability of the system. Therefore, the differentiation circuit 26 differentiates an output signal of the comparison circuit 24 to generate a first-order integral value. The second-order integral value and the first-order integral value are fed back via the time-to-current conversion circuits 18A and 18B, respectively.

The swap circuit 14A swaps pulse signals R1 and R2 output from the reference pulse generation circuit 12 in accordance with an output signal of the differentiation circuit 26 and outputs two pulse signals r1 and r2. That is, (r1, r2)=(R1, R2) and (r1, r2)=(R2, R1) are swapped in accordance with the logic level of the output signal of the differentiation circuit 26.

The time-to-current conversion circuit 18B receives the pulse signals r1 and r2 and outputs two pulse currents I1" and I2" in accordance with respective pulse widths of the pulse signals r1 and r2. The time-to-current conversion circuit 18B may be configured as illustrated in the example of FIG. 6.

The pulse currents I1, I1', and I1" are connected to the input terminal of the current mirror circuit 20, and the pulse currents I2, I2' and I2" are connected to the output terminal of the current mirror circuit 20. The current mirror circuit 20 mirrors an input current to generate an output current having the same size as that of the input current, and therefore, a differential current between the pulse current I1+I1'+I1" and the pulse current I2+I2'+I2" is output from the output terminal of the current mirror circuit 20.

Figure 15:
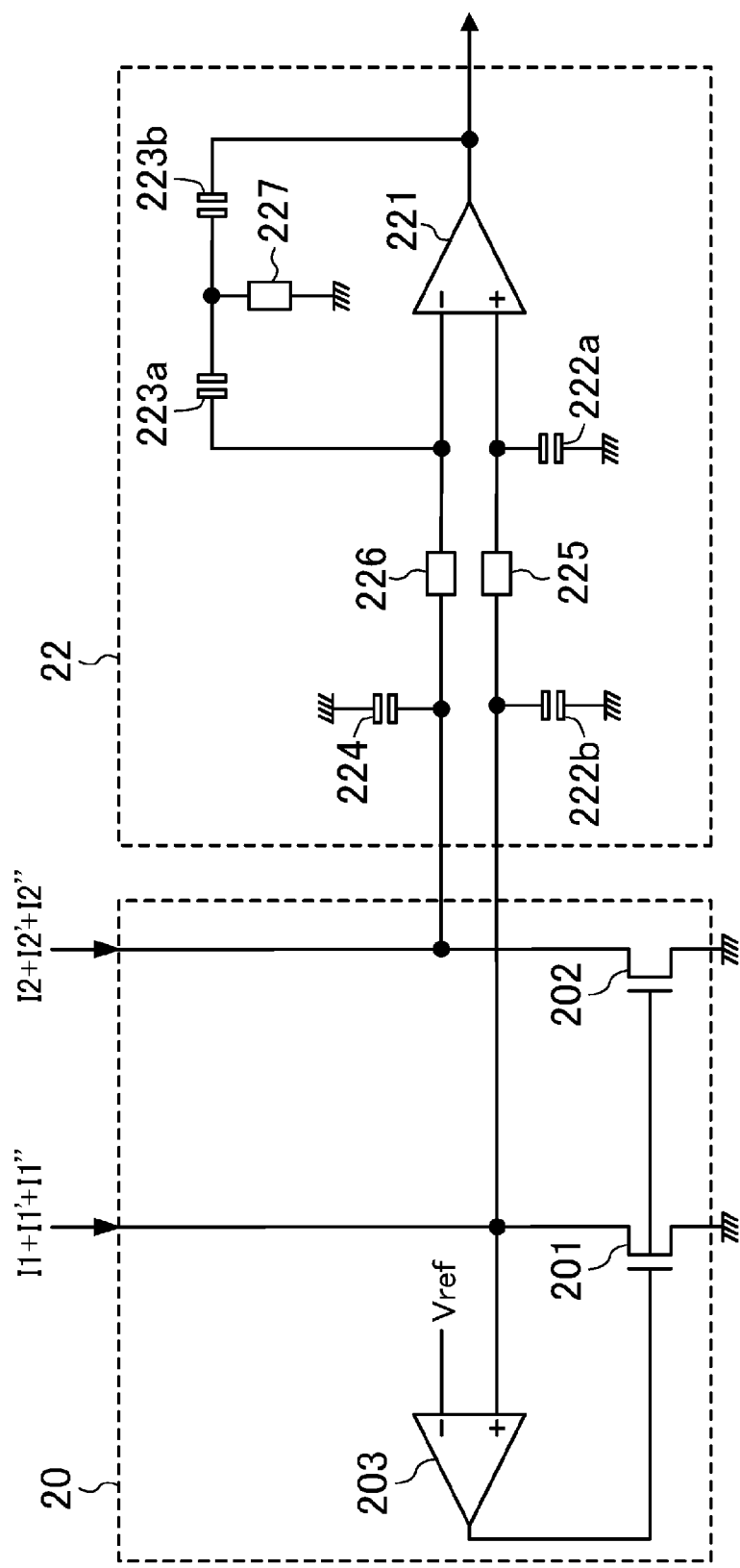
FIG. 15 is a block diagram illustrating a configuration of a current mirror circuit and a second-order integration circuit.

FIG. 15 is a block diagram illustrating an example configuration of the current mirror circuit 20 and the second-order integration circuit 22. The current mirror circuit 20 is the same as that illustrated in FIG. 7. The integration circuit 22 may include the operation amplifier 221, five capacitive elements 222*a*, 222*b*, 223*a*, 223*b*, and 224, and three resistive elements 225, 226, and 227.

The positive phase input terminal of the operation amplifier 221 and the input terminal of the current mirror circuit 20 are connected to each other via the resistive element 225. The capacitive element 222*a* is connected between a connection point of the positive phase input terminal of the operation amplifier 221 and a common node. The capacitive element 222*b* is connected between the other terminal of the resistive element 225 and the common node. The negative phase input terminal of the operation amplifier 221 and the output terminal of the current mirror circuit 20 are connected to each other via the resistive element 226. The capacitive elements 223*a* and 223*b* are connected in series between a connection point of the resistive element 226 and the negative phase input terminal of the operation amplifier 221 and an output terminal of the operation amplifier 221. The capacitive element 224 is connected between the other terminal of the resistive element 226 and the common node. The resistive element 227 is connected between a connection point of the capacitive elements 223*a* and 223*b* and the common node.

In this case, if it is assumed that the gain of the operation amplifier 221 is A2, the capacitance value of the capacitive elements 222*a*, 222*b*, 223*a*, 223*b*, and 224 is C1, the resistance value of the resistive element 226 is R1, and the resistance value of the resistive elements 225 and 227 is R1/2, the output voltage Vo of the integration circuit 22 is expressed by the following expression. Note that s in the equation is a Laplace operator.

$$V_o = \frac{2(I_1 - I_2)A_2}{sC_1(sC_1R_1(1 + A_2) + 4)}$$ [Expression 3]

This expression indicates that second-order integration characteristics of the integration circuit 22 are determined without depending on frequency characteristics of the current mirror circuit 20. Therefore, using the current mirror circuit 20 and the integration circuit 22 according to the example of FIG. 15, a differential current between the pulse current I1+I1'+I1" and the pulse current I2+I2'+I2" can be integrated in second-order with very high accuracy.

Thus, although a second-order integral value is output from the integration circuit 22. Therefore, the stability of the system is not kept only by a second-order feedback group made of the swap circuit 14 and the time-to-current conversion circuit 18A, the system can be operated in a stable manner by adding a first-order feedback group made of the differentiation circuit 26, the swap circuit 14A, and the time-to-current conversion circuit 18B.

As described above, using the oversampling time-to-digital converter according to this embodiment, the time difference between edges of the input signals T1 and T2 can be ΔΣ modulated by second-order integration. Thus, higher accurate time-to-digital conversion is enabled.

Note that the swap circuits 14a-14d according to the second embodiment may be added to each of the oversampling time-to-digital converters according to the third and fourth embodiments. Thus, for the oversampling time-to-digital converters according to the third and fourth embodiments, a delay error, an electric current error, and a current mirror ratio error can be also automatically cancelled without calibration, and higher accurate time-to-digital conversion is enabled.

For each of the above-described embodiments, a pulse generation circuit having the same configuration as that of the input pulse generation circuit 10 may be inserted at an output side of each of the swap circuits 14 and 14A to perform waveform shaping of the pulse signals r1 and r2 output from the swap circuits 14 and 14A. Thus, edge characteristics of the pulse signals t1 and t2 and edge characteristics of the pulse signals r1 and r2 may be caused to match to each other, and higher accurate time-to-digital conversion is enabled.

Moreover, for each of the above-described embodiments, the pulse signals r1 and r2 are generated n times each time the input signals T1 and T2 are input to the oversampling time-to-digital converter, that is, electrical charge information corresponding to the time difference between edges of the pulse signals r1 and r2 is integrated n times each time electrical charge information corresponding to the time difference between edges of the input signals T1 and T2 is integrated once, and thereby, a time difference range in which the oversampling time-to-digital converter may perform digital conversion may be extended to ±nT.

What is claimed is:

1. An oversampling time-to-digital converter, comprising:
an input pulse generation circuit configured to generate two pulse signals from two input signals such that a time difference between respective start edges of the two pulse signals is equal to a time difference between respective edges of the two input signals and respective end edges of the two pulse signals match each other;
a reference pulse generation circuit configured to generate two pulse signals from a reference clock signal such that a time difference between respective start edges of the two pulse signals is equal to a cycle of the reference clock signal and respective end edges of the two pulse signals match each other;
a swap circuit configured to receive the two pulse signals output from the reference pulse generation circuit and to swap the received two pulse signals in accordance with a control signal to output the pulse signals;
a multiplexer configured to receive the two pulse signals output from the input pulse generation circuit and the two pulse signals output from the swap circuit and to selectively output the two pulse signals output from the input pulse generation circuit or the swap circuit;
a time-to-current conversion circuit configured to output two pulse currents in accordance with respective pulse widths of the two pulse signals output from the multiplexer;
a current mirror circuit configured such that one of the two pulse currents is connected to an input terminal of the current mirror circuit and the other of the two pulse currents is connected to an output terminal of the current mirror circuit;
an integration circuit configured to integrate a differential current between the pulse current connected to the output terminal of the current mirror circuit and an output current of the current mirror circuit; and
a comparison circuit configured to compare an output signal of the integration circuit to a threshold voltage,
wherein
an output signal of the comparison circuit is given as the control signal to the swap circuit.

2. An oversampling time-to-digital converter, comprising:
an input pulse generation circuit configured to generate two pulse signals from two input signals such that a time difference between respective start edges of the two pulse signals is equal to a time difference between respective edges of the two input signals and respective end edges of the two pulse signals match each other;
a reference pulse generation circuit configured to generate two pulse signals from a reference clock signal such that a time difference between respective start edges of the two pulse signals is equal to a cycle of the reference clock signal and respective end edges of the pulse signals match each other;
a swap circuit configured to receive the two pulse signals output from the reference pulse generation circuit and to swap the received two pulse signals in accordance with a control signal to output the pulse signals;
a first time-to-current conversion circuit configured to output two pulse currents in accordance with respective pulse widths of the two pulse signals output from the input pulse generation circuit;
a second time-to-current conversion circuit configured to output two pulse currents in accordance with respective pulse widths of the two pulse signals output from the swap circuit;
a current mirror circuit configured such that one of the two pulse currents output from the first time-to-current conversion circuit and one of the two pulse currents output from the second time-to-current conversion circuit are connected to an input terminal of the current mirror circuit and the other of the two pulse currents output from the first time-to-current conversion circuit and the other of the two pulse currents output from the second time-to-current conversion circuit are connected to an output terminal of the current mirror circuit;
an integration circuit configured to integrate a differential current between the pulse current connected to the output terminal of the current mirror circuit and an output current of the current mirror circuit; and
a comparison circuit configured to compare an output signal of the integration circuit to a threshold voltage,
wherein
an output signal of the comparison circuit is given as the control signal to the swap circuit.

3. The oversampling time-to-digital converter of claim 1, further comprising:
a swap circuit configured to swap respective current sources of the two pulse currents in accordance with a control signal.

4. The oversampling time-to-digital converter of claim 2, comprising:
a swap circuit configured to swap respective current sources of the two pulse currents output from the first time-to-current conversion circuit in accordance with a control signal.

5. The oversampling time-to-digital converter of claim 1, further comprising:
a swap circuit configured to swap, in accordance with a control signal, a transistor configured to generate an input current of the current mirror circuit and a transistor configured to generate an output current of the current mirror circuit.

6. The oversampling time-to-digital converter of claim 2, further comprising:
a swap circuit configured to swap, in accordance with a control signal, a transistor configured to generate an input current of the current mirror circuit and a transistor configured to generate an output current of the current mirror circuit.

7. The oversampling time-to-digital converter of claim 1, further comprising:
a swap circuit configured to swap respective signal paths of the two input signals in accordance with a control signal.

8. The oversampling time-to-digital converter of claim 2, further comprising:
a swap circuit configured to swap respective signal paths of the two input signals in accordance with a control signal.

9. The oversampling time-to-digital converter of claim 1, wherein
the integration circuit includes
an operation amplifier configured such that a negative phase input terminal thereof is connected to the output terminal of the current mirror circuit and a positive phase input terminal thereof is connected to the input terminal of the current mirror circuit,
a first capacitive element configured such that a first terminal thereof is connected to the positive phase input terminal of the operation amplifier and a second terminal thereof is connected to a common node, and
a second capacitive element configured such that a first terminal thereof is connected to the negative phase input terminal of the operation amplifier and a second terminal thereof is connected to the output terminal of the operation amplifier.

10. The oversampling time-to-digital converter of claim 2, wherein
the integration circuit includes
an operation amplifier configured such that a negative phase input terminal thereof is connected to the output terminal of the current mirror circuit and a positive phase input terminal thereof is connected to the input terminal of the current mirror circuit,
a first capacitive element configured such that a first terminal thereof is connected to the positive phase input terminal of the operation amplifier and a second terminal thereof is connected to a common node, and
a second capacitive element configured such that a first terminal thereof is connected to the negative phase input terminal of the operation amplifier and a second terminal thereof is connected to the output terminal of the operation amplifier.

11. The oversampling time-to-digital converter of claim 2, further comprising:
a differentiation circuit configured to differentiate the output signal of the comparison circuit;
a second swap circuit configured to receive the two pulse signals output from the reference pulse generation circuit, to swap the received two pulse signals in accordance with the output signal of the differentiation circuit, and to output the two pulse signals; and
a third time-to-current conversion circuit configured to output two pulse currents in accordance with respective pulse widths of the two pulse signals output from the second swap circuit,
wherein
one of the two pulse currents output from the third time-to-current conversion circuit is connected to the input terminal of the current mirror circuit and the other of the two pulse currents is connected to the output terminal of the current mirror circuit, and
the integration circuit is a second-order integration circuit.

12. The oversampling time-to-digital converter of claim 11, wherein
the integration circuit includes
an operation amplifier,
a first resistive element configured such that a first terminal thereof is connected to the positive phase input terminal of the operation amplifier and a second terminal thereof is connected to the input terminal of the current mirror circuit,
a first capacitive element configured such that a first terminal thereof is connected to the first terminal of the first resistive element and a second terminal thereof is connected to a common node,
a second capacitive element configured such that a first terminal thereof is connected to the second terminal of the first resistive element and a second terminal thereof is connected to the common node,
a second resistive element configured such that a first terminal thereof is connected to a negative phase input terminal of the operation amplifier and a second terminal thereof is connected to the output terminal of the current mirror circuit,
third and fourth capacitive elements connected in series between the negative phase input terminal of the operation amplifier and an output terminal of the operation amplifier,
a fifth capacitive element configured such that a first terminal thereof is connected to the second terminal of the second resistive element and a second terminal thereof is connected to the common node, and
a third resistive element configured such that a first terminal thereof is connected to a connection point of the third and fourth capacitive elements and a second terminal thereof is connected to the common node.

13. The oversampling time-to-digital converter of claim 1, wherein
the input pulse generation circuit includes
first and second flip-flop circuits configured such that each of the two input signals is clock input to an corresponding one of the first and second flip-flop circuits, and
a reset circuit configured to detect an edge of an output signal of each of the first and second flip-flop circuits to reset the first and second flip-flop circuit.

14. The oversampling time-to-digital converter of claim 2, wherein
the input pulse generation circuit includes
first and second flip-flop circuits configured such that each of the two input signals is clock input to an corresponding one of the first and second flip-flop circuits, and
a reset circuit configured to detect an edge of an output signal of each of the first and second flip-flop circuits to reset the first and second flip-flop circuit.

15. The oversampling time-to-digital converter of claim 1, wherein
the current mirror circuit includes
first and second transistors whose gates are connected to each other, and
an operation amplifier configured such that a positive phase input terminal thereof is connected to a drain of the first transistor, a reference voltage is connected to a negative phase input terminal thereof, and an output terminal thereof is connected to the gate of the first transistor.

16. The oversampling time-to-digital converter of claim 2, wherein
the current mirror circuit includes
first and second transistors gates of which are connected to each other, and
an operation amplifier configured such that a positive phase input terminal thereof is connected to a drain of the first transistor, a reference voltage is connected to a negative phase input terminal thereof, and an output terminal thereof is connected to the gate of the first transistor.

17. The oversampling time-to-digital converter of claim 1, wherein
the current mirror circuit includes first and second transistors whose gates are connected to each other, and
the gate and a drain of the first transistor are connected to each other.

18. The oversampling time-to-digital converter of claim 2, wherein
the current mirror circuit includes first and second transistors whose gates are connected to each other, and
the gate and a drain of the first transistor are connected to each other.

19. A pulse current generation circuit to whose input terminal a pulse signal is input and from whose output terminal a pulse current is output, whose pulse width corresponds to that of the pulse signal, comprising:
a current source;
a first switch element connected to the current source and configured to output the pulse current in accordance with the pulse signal; and
a dummy path connected to the current source and configured to cause, when the first switch element is nonconductive, a current of the current source to flow, wherein:
the dummy path includes a second switch element configured to be conductive when the first switch element is nonconductive, and to be nonconductive when the first switch element is conductive,
the first switch element is a first MOS transistor configured such that a source thereof is connected to the current source, a gate thereof is connected to the input terminal, and a drain thereof is connected to the output terminal, and
the second switch element is a second MOS transistor configured such that a source thereof is connected to the current source and a gate thereof is connected to an inversion signal of the input terminal.

20. The pulse current generation circuit of claim 19, further comprising:
a voltage buffer circuit configured such that an input terminal thereof is connected to the drain of the first MOS transistor, and an output terminal thereof is connected to the drain of the second MOS transistor.

* * * * *